(12) United States Patent  
Nanjo

(10) Patent No.: US 9,253,882 B2  
(45) Date of Patent: Feb. 2, 2016

(54) ELECTRONIC COMPONENT BUILT-IN MULTI-LAYER WIRING BOARD AND METHOD OF MANUFACTURING THE SAME

(71) Applicant: FUJIKURA LTD., Tokyo (JP)

(72) Inventor: Hirokazu Nanjo, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/451,215

(22) Filed: Aug. 4, 2014

(65) Prior Publication Data

US 2015/0036305 A1     Feb. 5, 2015

(30) Foreign Application Priority Data

Aug. 5, 2013   (JP) ................................ 2013-162214

(51) Int. Cl.

| H05K 1/18 | (2006.01) |
|---|---|
| H05K 1/02 | (2006.01) |
| H05K 1/11 | (2006.01) |
| H05K 1/14 | (2006.01) |
| H05K 3/30 | (2006.01) |
| H05K 3/46 | (2006.01) |

(52) U.S. Cl.
CPC .............. *H05K 1/0298* (2013.01); *H05K 1/115* (2013.01); *H05K 1/142* (2013.01); *H05K 1/144* (2013.01); *H05K 1/185* (2013.01); *H05K 3/306* (2013.01); *H05K 3/4679* (2013.01)

(58) Field of Classification Search
USPC ................... 361/803, 760–795; 174/259–262
See application file for complete search history.

(56) References Cited

U.S. PATENT DOCUMENTS

| 7,161,371 | B2 * | 1/2007 | Higashitani et al. ........... 361/728 |
|---|---|---|---|
| 8,124,883 | B2 * | 2/2012 | Chikagawa .................... 174/260 |
| 2005/0122698 | A1 * | 6/2005 | Ho et al. ........................ 361/761 |
| 2009/0290318 | A1 | 11/2009 | Takahashi | |
| 2010/0027225 | A1 | 2/2010 | Yuda et al. | |
| 2010/0044845 | A1 | 2/2010 | Funaya et al. | |
| 2011/0121445 | A1 | 5/2011 | Mori et al. | |
| 2013/0003314 | A1 | 1/2013 | Igarashi et al. | |

FOREIGN PATENT DOCUMENTS

| JP | 11-317582 | A | 11/1999 |
|---|---|---|---|
| JP | 2009-289802 | A | 12/2009 |
| WO | 2007/126090 | A1 | 11/2007 |
| WO | 2008/136251 | A1 | 11/2008 |
| WO | 2009/141927 | A1 | 11/2009 |
| WO | 2010/010911 | A1 | 1/2010 |
| WO | 2011/102561 | A1 | 8/2011 |

* cited by examiner

*Primary Examiner* — Tuan T Dinh  
(74) *Attorney, Agent, or Firm* — Westerman, Hattori, Daniels & Adrian, LLP

(57) ABSTRACT

An electronic component built-in multi-layer wiring board that comprises collectively stacked therein a plurality of first printed wiring boards by thermal compression bonding, and that comprises an electronic component package built in thereto, wherein the electronic component package comprises a first electronic component built in thereto and a plurality of second printed wiring boards stacked to have electrodes on an outermost surface of the package at a pitch that is wider than the electrode pitch of the first electronic component and that is matched to the wiring pitch of the first printed wiring boards, the electronic component built-in multi-layer wiring board includes a second electronic component having a thickness which is greater than that of the first electronic component, and the electronic component package having a thickness which is 80% to 125% of the thickness of the second electronic component.

6 Claims, 4 Drawing Sheets

ELECTRONIC COMPONENT BUILT-IN MULTI-LAYER WIRING BOARD AND METHOD OF MANUFACTURING THE SAME

CROSS-REFERENCE TO RELATED APPLICATIONS

This application is based upon and claims the benefit of priority from the prior Japanese Patent Application No. 2013-162214, filed on Aug. 5, 2013, the entire contents of which are incorporated herein by reference.

BACKGROUND OF THE INVENTION

1. Field of the Invention

This invention relates to an electronic component built-in multi-layer wiring board having an electronic component built in thereto, and a method of manufacturing the same.

2. Description of the Prior Art

With the recent miniaturization of electronic equipment or the like, the multi-layer wiring board, which is one of the parts of the electronic equipment or the like, has required various improvements, and the chip size of the wafer level package (WLP), for example, that is surface mounted on the multi-layer wiring board has been reduced with respect to the number of IC pins.

Thus, a problem often arises where the bump pitch of a usual WLP is too small to allow for surface mounting of the WLP on the multi-layer wiring board. To respond to this problem, mixing of wiring patterns or electrodes having different wiring pitches on the multi-layer wiring board will reduce the whole production yield. With respect to this problem, for example, a solution as the multi-layer wiring board disclosed in JPH 11-317582 is proposed.

Specifically, the multi-layer wiring board in JPH 11-317582 has a structure in which the mother wiring board having a usual-density wiring pattern formed thereon has a recess formed therein, the recess contains a carrier wiring board having a high-density wiring pattern formed thereon, and the wirings are electrically connected. The multi-layer wiring board may thus surface mount various electronic components of different electrode pitches.

SUMMARY OF THE INVENTION

Unfortunately, the electronic component built-in multi-layer wiring board having an electronic component built in between layers in a multi-layer wiring board according to the conventional technology as disclosed in JPH 11-317582, for example, could not form easily. Because the bump pitch of the electronic component is too small as in the surface mounting, the alignment and handling of the electronic component and substrate require high accuracy and the wiring lines from the IC mounting terminal requires complicated routing and microfabrication.

It is an object of this invention to provide an electronic component built-in multi-layer wiring board and a method of manufacturing the same, wherein the electronic component built-in multi-layer wiring board may solve the above problems caused by the conventional technology, readily have an electronic component built in, have high reliability of alignment, handling, and wiring, and correspond to high densification.

An electronic component built-in multi-layer wiring board according to an embodiment of the present invention that comprises collectively stacked therein a plurality of first printed wiring boards by thermal compression bonding, and that comprises an electronic component package built in thereto, wherein the electronic component package comprises a first electronic component built in thereto and a plurality of second printed wiring boards stacked to have electrodes on an outermost surface of the package at a pitch that is wider than the electrode pitch of the first electronic component and that is matched to the wiring pitch of the first printed wiring boards, the electronic component built-in multi-layer wiring board includes a second electronic component having a thickness which is greater than that of the first electronic component, and the electronic component package having a height which is 80% to 125% of the thickness of the second electronic component.

Due to the electronic component built-in multi-layer wiring board according to the embodiment of the present invention, that comprises a first electronic component built in to an electronic component package, the electronic component package comprising a plurality of second printed wiring boards stacked to have electrodes on an outermost surface of the package at a pitch that is wider than the electrode pitch of the first electronic component and that is matched to the wiring pitch of the first printed wiring board, and the electronic component package has a height which is 80% to 125 of the thickness of a second electronic component that has a thickness which is greater than that of the first electronic component and that is built in to the electronic component built-in multi-layer wiring board, thus allowing for higher reliability of the alignment and handling of the mounted electronic component package and the electronic component. In addition, in the electronic component package, the electrode pitch of the first electronic component is matched to the wiring pitch of the first printed wiring board, thus allowing for higher reliability of the wiring line. Thus, the electronic component may be readily built in to respond to high densification.

According to the electronic component built-in multi-layer wiring board in another embodiment, the electronic component package comprises, in the second printed wiring boards: a first-layer wiring board disposed on a rear surface side which is an opposite side to the electrode formation surface side of the first electronic component; a second-layer wiring board having formed therein an opening where the first electronic component is built; a third-layer wiring board comprising conductive paste vias formed therein at a pitch matched to the electrode pitch of the first electronic component, and electrodes formed on one surface thereof, the electrodes enlarging the pitch from the electrode pitch of the first electronic component to the wiring pitch of the first printed wiring board; and a fourth-layer wiring board comprising electrodes formed on one surface thereof at a pitch matched to the wiring pitch of the first printed wiring board and conductive paste vias formed therein, the first-layer to forth-layer wiring boards are collectively stacked with the first electronic component built in to the opening of the second-layer wiring board with the conductive paste vias in the third-layer wiring board being opposed to the electrodes of the first electronic component, and with the conductive paste vias in the fourth-layer wiring board being disposed opposed to the electrodes of the third-layer wiring board.

According to the electronic component built-in multi-layer wiring board in another embodiment, the second printed wiring board is formed by an identical material to that of the first printed wiring board.

According to the electronic component built-in multi-layer wiring board in another embodiment, a certain first printed wiring board of a plurality of first printed wiring boards disposed in an interlayer of the electronic component built-in multi-layer wiring board has formed therein openings capable of mounting the second electronic component and the electronic component package, respectively, and with the second electronic component and the electronic component package being mounted in the respective openings, the first printed wiring boards are collectively stacked.

The electronic component built-in multi-layer wiring board in another embodiment further comprises a third electronic component different from the first and second electronic components, the third electronic component being surface-mounted immediately above or below the built-in location of the electronic component package with electrodes of the third electronic component formed at a pitch matched to the wiring pitch of the first printed wiring board being connected to the electrodes of the electronic component package by an electrically shortest path.

A method of manufacturing an electronic component built-in multi-layer wiring board according to an embodiment of the present invention is a method of manufacturing an electronic component built-in multi-layer wiring board comprising collectively stacked therein a plurality of first printed wiring boards by thermal compression bonding and an electronic component package built in thereto, the method comprising the steps of: forming the electronic component package by providing a first electronic component to be built in the package and by stacking a plurality of second printed wiring boards to have electrodes on an outermost surface of the package at a pitch that is wider than the electrode pitch of the first electronic component and that is matched to the wiring pitch of the first printed wiring boards, and forming in a certain first printed wiring board of a plurality of first printed circuit boards has formed therein openings capable of mounting a second electronic component having a thickness which is greater than that of the first electronic component and the electronic component package, respectively, and stacking, with the second electronic component and the electronic component package being mounted in the respective openings, the first printed wiring boards to close the openings, the step of forming the electronic component package comprising forming the electronic component package to have a height which is 80% to 125% of the thickness of the second electronic component.

Due to the method of manufacturing an electronic component built-in multi-layer wiring board according to the embodiment of the present invention may provide working effects similar to those in the above electronic component built-in multi-layer wiring board, and may readily manufacture the electronic component built-in multi-layer wiring board at a low cost.

According to the method of manufacturing an electronic component built-in multi-layer wiring board in another embodiment, the step of forming the electronic component package comprising collectively stacking, in the second printed wiring boards, a first-layer wiring board disposed on a rear surface side which is an opposite side to the electrode formation surface side of the first electronic component; a second-layer wiring board having formed therein an opening where the first electronic component is built; a third-layer wiring board comprising conductive paste vias formed therein at a pitch matched to the electrode pitch of the first electronic component, and electrodes formed on one surface thereof, the electrodes enlarging the pitch from the electrode pitch of the first electronic component to the wiring pitch of the first printed wiring board; and a fourth-layer wiring board comprising electrodes formed on one surface thereof at a pitch matched to the wiring pitch of the first printed wiring board and conductive paste vias formed therein, the collectively stacking being carried out with the first electronic component being built in to the opening of the second-layer wiring board with the conductive paste vias in the third-layer wiring board being opposed to the electrodes of the first electronic component, and with the conductive paste vias in the fourth-layer wiring board being disposed opposed to the electrodes of the third-layer wiring board.

DESCRIPTION OF THE PREFERRED EMBODIMENTS

With reference to the accompanying drawings, an electronic component built-in multi-layer wiring board according to an embodiment of this invention and a method of manufacturing the same will be described below in more detail.

Figure 1:
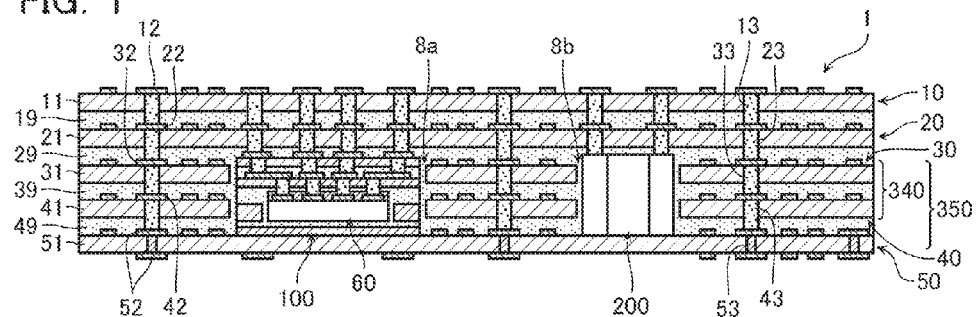
FIG. 1 is a cross-sectional view showing a structure of an electronic component built-in multi-layer wiring board formed by a method of manufacturing an electronic component built-in multi-layer wiring board according to an embodiment of the present invention.
Figure 2:
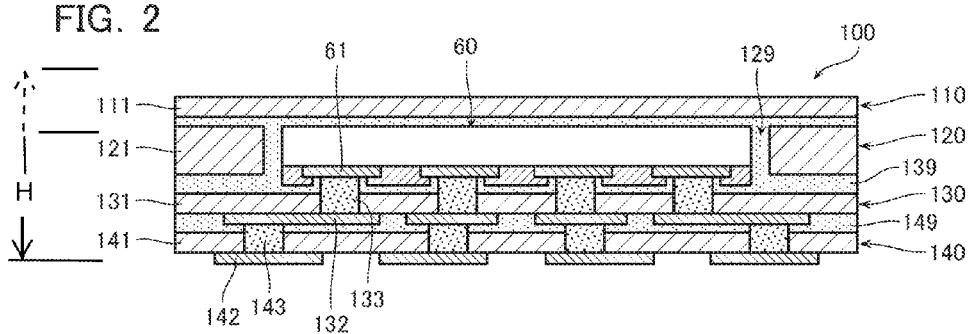
FIG. 2 is a cross-sectional view showing a structure of an electronic component package built in to the electronic component built-in multi-layer wiring board due to same method of manufacturing.
Figure 3:
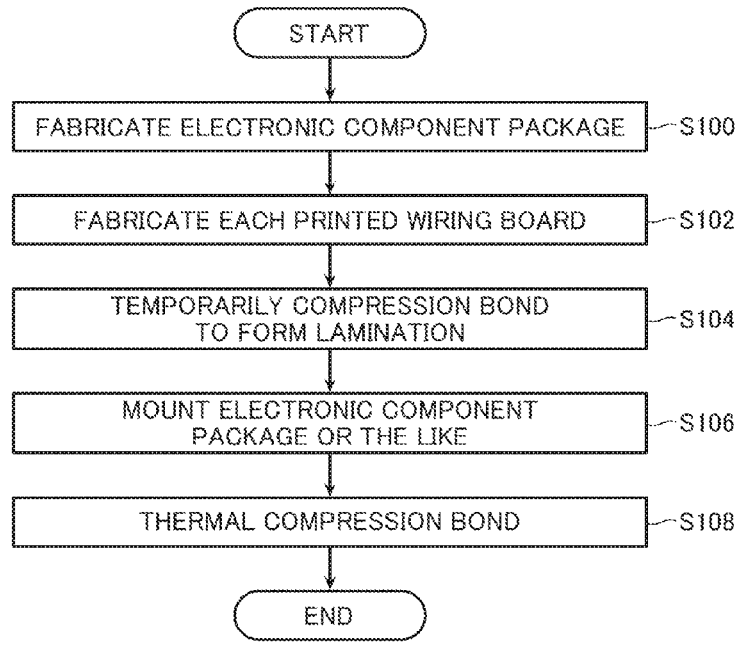
FIG. 3 is a flowchart showing manufacturing processes of the electronic component built-in multi-layer wiring board due to same method of manufacturing.
Figure 4:
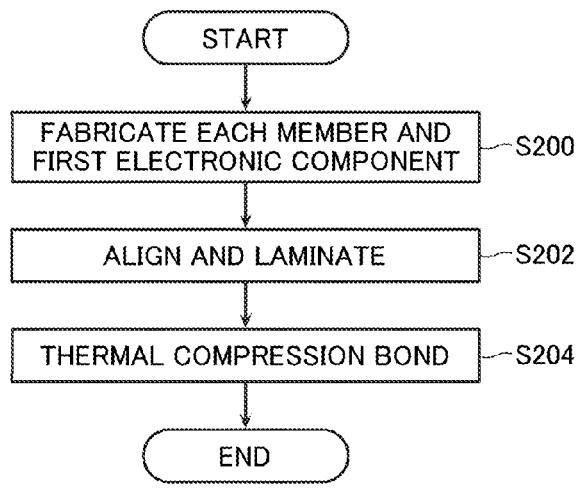
FIG. 4 is a flowchart showing manufacturing processes of the electronic component package in the manufacturing processes of the electronic component built-in multi-layer wiring board due to same method of manufacturing.

FIG. 1 is a cross-sectional view showing a structure of an electronic component built-in multi-layer wiring board formed by a method of manufacturing an electronic component built-in multi-layer wiring board according to an embodiment of the present invention. FIG. 2 is a cross-sectional view showing a structure of an electronic component package built in to the electronic component built-in multi-layer wiring board due to same method of manufacturing. FIG. 3 is a flowchart showing manufacturing processes of the electronic component built-in multi-layer wiring board due to same method of manufacturing. FIG. 4 is a flowchart showing manufacturing processes of the electronic component package in the manufacturing processes of the electronic component built-in multi-layer wiring board due to same method of manufacturing.

FIGS. 5A, 5B, 5C, 5D, 5E and 5F are each a cross-sectional view showing the electronic component package due to same method of manufacturing, on a manufacturing process basis. FIGS. 6A, 6B, 6C, 6D, 6E, 6F, 6G, 6H and 6I are each a cross-sectional view showing the electronic component built-in multi-layer wiring board due to same method of manufacturing, on a manufacturing process basis. An electronic component built-in multi-layer wiring board (hereinafter abbreviated as a "multi-layer wiring board") 1 according to the present embodiment is a multi-layer structure wiring board that comprises stacked therein a plurality of first printed wiring boards and an electronic component package built in thereto.

As shown in FIG. 1, the multi-layer wiring board 1 has a structure comprising, for example, as the first printed wiring boards, a first printed wiring board 10, a second printed wiring board 20, a third printed wiring board 30, a fourth printed wiring board 40, and a fifth printed wiring board 50, all of which are, for example, stacked collectively by thermal compression bonding.

The multi-layer wiring board 1 is, for example, configured having built in thereto an electronic component package 100 and a second electronic component 200 each disposed between the second and fifth printed wiring boards 20 and 50. Specifically, the electronic component package 100 and the second electronic component 200 are built in to an opening 8a for mounting a package and an opening 8b for mounting an electronic component, respectively. The openings 8a and 8b are formed in certain locations in a lamination 350 of the third through fifth printed wiring boards 30 to 50.

In this case, the electronic component package 100 is formed to have a height which is equivalent to the depth of the opening 8a formed in the lamination 350. In other words, it can be said that the height of the electronic component package 100 is nearly equal to the thickness of a lamination 340 of the third and fourth printed wiring boards 30 and 40. Although these laminations 340 and 350 each comprise a lamination of a plurality of printed wiring boards as shown in FIG. 1, they may each comprise one printed wiring board.

Note that the second electronic component 200 built in to the opening 8b in the lamination 350 has a thickness which is greater than, for example, that of a first electronic component 60 and the electronic component package 100. The first through fourth printed wiring boards 10 to 40 respectively comprise, for example, a single-sided CCL (Single-sided Copper Clad Laminate). The fifth printed wiring board 50 comprises a double-sided CCL (Double-sided Copper Clad Laminate).

The first through fourth printed wiring boards 10 to 40 respectively comprise first through fourth resin bases 11, 21, 31, and 41 which are each an insulating layer, and wiring circuits 12, 22, 32, and 42 that are each a wiring pattern, or the like, and are formed on one of surfaces (a single side) of these first through fourth resin bases 11 to 41, respectively. The fifth printed wiring board 50 comprises a fifth resin base 51 which is an insulating layer, and wiring circuits 52 that are each a wiring pattern, or the like, and are respectively formed on both of surfaces (both sides) of this fifth resin base 51.

In addition, the first through fourth printed wiring boards 10 to 40 each comprise adhesive layers 19, 29, 39, and 49 formed on an opposite side to a side of the wiring circuits 12 to 42 of each of the resin bases 11 to 41. The printed wiring boards 10 to 40 also each comprise conductive paste vias (hereinafter referred to as "vias") 13, 23, 33, and 43 formed by filling a conductive paste into a through-hole formed in each of the resin bases 11 to 41 and the adhesive layers 19 to 49. The vias 13, 23, 33, and 43 are for making interlayer connection between the wiring circuits 12 to 52 of each of the printed wiring boards 10 to 50. Note that the adhesive layers 19 to 49 are configured from, for example, an adhesive agent of an epoxy system or an acrylic system, and so on, or an organic system adhesive agent including a volatile component, and so on.

The fifth printed wiring board 50 comprises a via 53 that connects between each of the wiring circuits 52 and that is formed by plating in a through-hole. The via 53 is configured from a plated via of a laser via hole (LVH). The via 53 has a structure formed by forming a through-hole in the fifth resin base 51 by a method such as a laser or a drill from the wiring circuit 52 on one surface side of the fifth resin base 51 without penetrating the wiring line circuit 52 on the other surface side of the fifth resin substrate 51, and by plating the through-hole. The via 53 is formed, for example, by a copper plating as a conductive material.

If the via 53 is formed by plating as described above, a not-shown plating layer is formed on one of the wiring circuits 52. In addition, the via 53 may be formed by, although not shown, filling a conductive paste into a through-hole formed in the fifth resin base 51 or by a plated through-hole having a structure formed by plating a through-hole (TH) penetrating the wiring circuits 52.

The first through fifth resin bases 11 to 52 are each configured by, for example, a resin film. The resin film may be, for example, a resin film comprising polyimide, polyamide, polyolefin, liquid crystal polymer (LCP), or the like, or a resin film comprising a thermosetting epoxy resin, or the like.

The wiring circuits 12 to 52 are formed by, for example, patterning a conductive material such as a copper foil. Also, the conductive paste configuring the vias 13 to 53 includes, for example, at least one kind of metallic particle of low electrical resistance selected from nickel, gold, silver, copper, aluminum, and iron, or the like, and at least one kind of metallic particle of low melting point selected from tin, bismuth, indium, and lead, or the like. The conductive paste is configured from a paste comprising these metallic particles mixed with a binder component whose main component is an epoxy, an acrylic, a urethane, or the like.

In such a conductive paste, the metal of low melting point contained therein may be melted at a temperature of, for example, 200° C. or less to form an alloy. In particular, the conductive paste has characteristics of the ability to form intermetallic compounds with metals such as copper and silver. Therefore, the connections between the vias 13 to and the wiring circuits 12 to 52 are alloyed by intermetallic compounds when collectively stacked by thermal compression bonding.

Note that the conductive paste may comprise, for example, nano paste. The nano paste comprises a mixture of a filler having a nanolevel particle diameter, such as gold, silver, copper, and nickel, and the binder component as described above. In addition, the conductive paste may comprise paste comprising a mixture of the above metallic particles such as nickel and the binder component as described above.

In this case, the conductive paste has characteristics of providing electrical connection through the contact between fellow metallic particles. Note that the conductive paste may be filled in a through-hole using various methods such as, for example, a printing method, a spin coating method, a spray coating method, a dispensing method, a laminating method, and combinations thereof.

Meanwhile, as shown in FIG. 2, the electronic component package 100 to be mounted (equipped) on the fifth printed wiring board 50 has a structure comprising, for example, as a plurality of second printed wiring boards, a first-layer wiring board 110, a second-layer wiring board 120, a third-layer wiring board 130, and a fourth-layer wiring board 140, all of which are, for example, stacked collectively by thermal compression bonding as in the above multi-layer wiring board 1.

The electronic component package 100 is configured, for example, having built in thereto a first electronic component 60 disposed between the first-layer and third-layer wiring boards 110 and 130. The electronic component package 100 has a structure that may be handled as a package module component. The first electronic component 60 comprises semiconductor devices such as, for example, a transistor, an integrated circuit (IC), and a diode.

The first-layer, second-layer, third-layer, and fourth-layer wiring boards 110, 120, 130, and 140 of the electronic component package 100 comprise first, second, third, and fourth insulating bases 111, 121, 131, and 141, respectively. The insulating bases 111, 121, 131, and 141 are insulating layers. Also, the third-layer and fourth-layer wiring boards 130 and 140 comprise wiring circuits 132 and 142 such as wiring patterns formed on one of surfaces of the third and fourth insulating bases 131 and 141, respectively.

The first-layer wiring board 110 comprises an adhesive layer 119 formed on the surface of the first insulating base 111 that faces the second-layer wiring board 120. The adhesive layer 119 is disposed on the surface that faces the rear surface side of the first electronic component 60. The rear surface side is an opposite side to the surface of the first electronic component 60 on which rewiring electrodes 61 are formed. The second-layer wiring board 120 comprises an opening 129 formed on the second insulating base 121 for containing the first electronic component 60. Note that the second insulating base 121 of the second-layer wiring board 120 is formed to have a thickness which is greater than that of the other insulating bases 111, 131, and 141.

The third-layer and fourth-layer wiring boards 130 and 140 comprise respective adhesive layers 139 and 149 formed on surfaces of opposite side to a side of the wiring circuits 132 and 142 of each of the third and fourth insulating bases 131 and 141. The printed wiring boards 130 and 140 also comprise vias 133 and 143 formed by filling a conductive paste into through-holes formed in the third and fourth insulating bases 131 and 141 and the adhesive layers 139 and 149, respectively. The vias 133 and 143 are for making interlayer connection between the wiring circuits 132 and 142 each of the third-layer and fourth-layer wiring boards 130 and 140 or the rewiring electrodes 61 of the first electronic component 60.

Note that the vias 133 in the third-layer wiring board 130 are formed at a pitch equal to the electrode pitch of the rewiring electrodes 61 of the first electronic component 60. The wiring circuit 132 of the third-layer wiring board 130 is formed in a wiring pattern that enlarges the pitch from the electrode pitch of the rewiring electrodes 61 of the first electronic component 60 to, for example, the wiring pitch of the wiring circuits 22 of the second printed wiring board 20 of the multi-layer wiring board 1.

Also, the wiring circuits 142 and the vias 143 of the fourth-layer wiring board 140 are formed at a pitch equal to the pitch of the wiring circuits 22 and the vias 23 of the second printed wiring board 20 of the above multi-layer wiring board 1. Here, the above first-layer and second-layer wiring boards 110 and 120 may have formed thereon, for example, the wiring circuits and vias as described above, like the third-layer and fourth-layer wiring boards 130 and 140.

The electronic component package 100 of such a structure comprises the first electronic component 60 built in to the opening 129 of the second-layer wiring board 120 with the end portions of the vias 133 of the third-layer wiring board 130 being opposed to the rewiring electrodes 61 of the first electronic component 60, and the fourth-layer and third-layer wiring boards 140 and 130 disposed with the vias 143 of the wiring board 140 opposed to the wiring circuits 132 of the wiring board 130, and the first-layer through fourth-layer wiring boards 110 to 140 being collectively stacked.

Therefore, the electronic component package 100 comprises the first-layer through fourth-layer wiring boards 110 to 140 stacked to have, on the outermost surface of the package, the wiring circuits 142 that may be used as electrodes at a pitch that is wider than the electrode pitch of the rewiring electrodes 61 of the first electronic component 60 and that is equal to the wiring pitch of the multi-layer wiring board 1. Note that the electronic component package 100 may comprise the same or different material from the multi-layer wiring board 1.

The second electronic component 200 built in to the opening 8b in the lamination 350 of the multi-layer wiring board 1 is built in thereto with the electronic component package 100, as described above. Here, the second electronic component 200 comprises devices such as, for example, a resistor, a capacitor, a relay, and a piezoelectric element. The second electronic component 200 has its thickness formed greater compared to the first electronic component 60 and the electronic component package 100. If, for example, the second electronic component 200 has a thickness of about 300 µm, the first electronic component 60 is formed to have a thickness of about 150 µm.

If, as described above, the openings 8a and 8b formed in the lamination 350 have the same depth, the second electronic component 200 will protrude out from the opening 8b further than the electronic component package 100. If, however, the electronic component package 100 is set to have a height (thickness) of, for example, 80% to 125% of the thickness of the second electronic component 200, some errors may be within a tolerance.

With the multi-layer wiring board 1 thus configured, it may be possible to previously manufacture the electronic component package 100 that has built therein the first electronic component 60 having a height equal to the depth of the opening 8a of the lamination 350, and to mount (equip) and have built the electronic component package 100 and the second electronic component 200 in the openings 8a and 8b, respectively, using a mounting mounter device for mounting an electronic component or the like. The electronic components may thus be mounted in a common process and built in an easy method, thus manufacturing the multi-layer wiring board 1 in an easy method.

In addition, the multi-layer wiring board 1 may have the electronic component package 100 built in with the rewiring electrodes 61 formed at a narrow electrode pitch in the first electronic component 60 being built in at a pitch that is wider than the electrode pitch and enlarged to be equal to the wiring pitch of the wiring circuits 12 or the like in the multi-layer wiring board 1. A multi-layer structure wiring board may thus be achieved that may reduce the increase of the thicknesses of the multi-layer wiring board 1 and the electronic component package 100 while it may form high-density wiring lines around the first electronic component 60, and may readily adjust the signal transmission characteristics and have good compatibility between each portion.

Next, a method of manufacturing the multi-layer wiring board 1 according to the present embodiment will be described.

First, as shown in FIG. 3, the electronic component package 100 to be built in the multi-layer wiring board 1 is fabricated (step S100). Here, the electronic component package 100 is manufactured as follows, for example. Specifically, as shown in FIG. 4, each of the members configuring the electronic component package 100, and the first electronic component 60 to be built in to this electronic component package 100 are fabricated (step S200).

In step S200, specifically, the first-layer through fourth-layer wiring boards 110 to 140 are fabricated and the first electronic component 60 is fabricated. Here, the third-layer wiring board 130 is described by way of example. However a like process may be used to manufacture the first-layer, the second-layer, and the fourth-layer wiring boards 110, 120, and 140.

Figure 5A:
FIG. 5A is a cross-sectional view showing the electronic component package due to same method of manufacturing, on a manufacturing process basis.
Figure 5B:
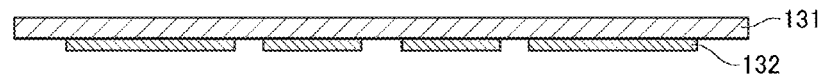
FIG. 5B is a cross-sectional view showing the electronic component package due to same method of manufacturing, on a manufacturing process basis.

First, as shown in FIG. 5A, a single-sided CCL is prepared that comprises the third insulating base 131 and a conductor layer 132a such as a solid-state copper foil formed on one surface thereof. Next, an etching resist is formed on the conductor layer 132a by photolithography, and then etching is performed to pattern form the wiring line circuit 132 as shown in FIG. 5B.

The single-sided CCL is configured from, for example, a structure in which the third insulating base 131 having a thickness of about 20 µm is affixed to the conductor layer 132a configured from copper foil having a thickness of about µm. If the conductor layer 132a comprises copper, employable as the single-sided CCL is, for example, a single-sided CCL made by applying a varnish of polyimide to copper foil and hardening the varnish, by a publicly known casting method.

Otherwise employable as the single-sided CCL are the likes of a single-sided CCL in which a seed layer is formed on a polyimide film by sputtering and the conductor layer 132a is formed by growing copper by plating, or a single-sided CCL made by attaching a rolled or electrolytic copper foil and a polyimide film by adhesive material.

Note that the resin base such as the third insulating base 131 may not necessarily comprise polyimide and may comprise a plastic film such as liquid crystal polymer as describe above. In addition, the etching may use an etchant comprising ferric chloride or cupric chloride or the like as the main component.

Figure 5C:
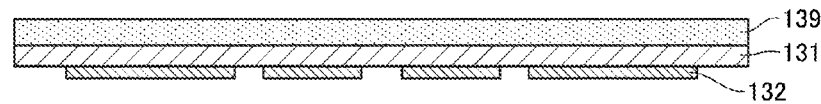
FIG. 5C is a cross-sectional view showing the electronic component package due to same method of manufacturing, on a manufacturing process basis.
Figure 5D:
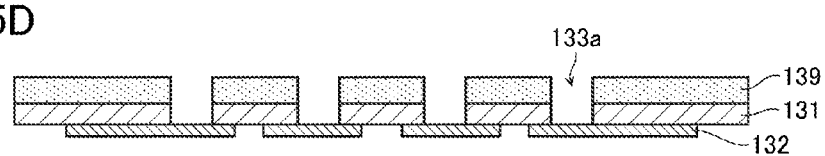
FIG. 5D is a cross-sectional view showing the electronic component package due to same method of manufacturing, on a manufacturing process basis.

After forming the wiring circuit 132, as shown in FIG. 5C, an adhesive agent is laminated on the other surface of the third insulating base 131 to form the adhesive layer 139. As shown in FIG. 5D, through-holes 133a are formed in certain locations that pass through the adhesive layer 139 and the third insulating base 131 to the wiring circuit 132. The through-holes 133a are then subjected to the desmear process.

The adhesive layer 139 may be, for example, an epoxy system thermosetting resin having a thickness of about 25 µm that has been rendered in a semi-hardened state. The thermal compression bonding in lamination may comprise, for example, using a vacuum laminator, and pressing in an atmosphere under reduced pressure and at a temperature at which the adhesive layer 139 is not cured, thus laminating the adhesive layer 139 on the third insulating base 131.

Note that the adhesive layers 139 or the like of the electronic component package 100 may comprise not only the above epoxy system thermosetting resin, but also a prepreg in which an epoxy system thermosetting resin is coated on the likes of a glass fabric and rendered in a semi-hardened state, or various kinds of resin, and so on. The through-holes 133a are formed in certain locations using, for example, a UV-YAG laser.

The through-holes 133a may be formed by other methods such as a carbon dioxide laser, an excimer laser, drilling, or chemical etching or the like. In addition, the desmear process may use, for plasma desmear, a mixed gas of $CF_4$ and $O_2$ (methane tetrafluoride+oxygen), but may also use another inert gases such as Ar (Argon). Furthermore, instead of the so-called dry process, a wet process using a chemical solution may be used.

Figure 5E:
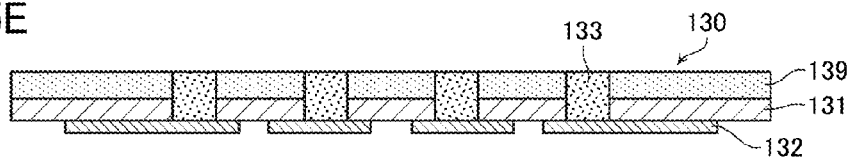
FIG. 5E is a cross-sectional view showing the electronic component package due to same method of manufacturing, on a manufacturing process basis.
Figure 5F:
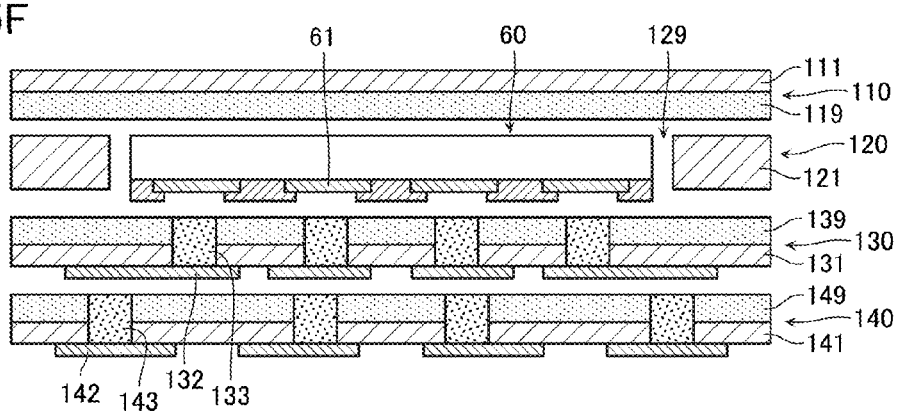
FIG. 5F is a cross-sectional view showing the electronic component package due to same method of manufacturing, on a manufacturing process basis.

After forming the through-holes 133a, as shown in FIG. 5E, conductive paste as described above may be filled into the through-holes 133a using, for example, the screen printing or the like to form the vias 133, whereby the third-layer wiring board 130 of the kind shown in FIG. 2 can be manufactured. Then, the first-layer, second-layer, and fourth-layer wiring boards 110, 120, and 140 are also likewise manufactured and prepared.

Note that the opening 129 in the second-layer wiring board 120 is formed by removing, using the UV-YAG laser or the like as described above, a portion of the second insulating base 121 in which the first electronic component 60 is to be built. In addition, although not shown, the first electronic component 60 is manufactured as follows for example.

First, a wafer with an inorganic insulating layer formed thereon before dicing is provided. Then, on the wafer surface, the rewiring electrodes 61 or the like are formed and an insulating layer or the like is formed. The wafer is then inspected, and thinned and diced into individual pieces, thus manufacturing the first electronic component 60. After manufacturing the members filled in the electronic component package 100 and the first electronic component 60 as described above, as shown in FIG. 5F, they are aligned and stacked (step S202), and subjected to thermal compression bonding (step S204).

Thus, the electronic component package 100 as shown in FIG. 2 may be manufactured in which the first electronic component 60 is built and the wiring circuits 132 and 142 and the vias 133 and 143 are formed that enlarge the electrode pitch of the rewiring electrodes 61 of the first electronic component 60 to a pitch equal to the wiring pitch of the wiring circuit 12 or the like of the multi-layer wiring board 1.

After manufacturing the electronic component package 100 as described above, the first through fifth printed wiring boards 10 to 50 included in the multi-layer wiring board 1 are fabricated (step S102). The printed wiring boards 10 to 50 may be manufactured like the wiring boards 110 to 140 in the layers of the above electronic component package 100, and thus their detailed description is omitted here. The third printed wiring board 30, for example, is manufactured as follows.

Figure 6A:
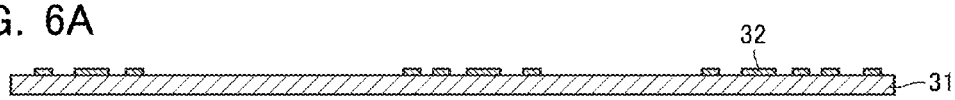
FIG. 6A is a cross-sectional view showing the electronic component built-in multi-layer wiring board due to same method of manufacturing, on a manufacturing process basis.
Figure 6B:
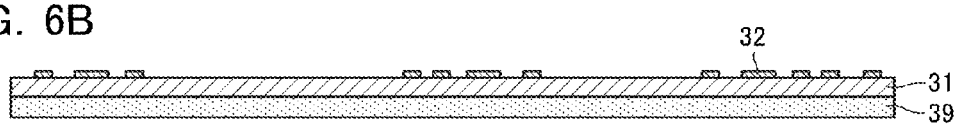
FIG. 6B is a cross-sectional view showing the electronic component built-in multi-layer wiring board due to same method of manufacturing, on a manufacturing process basis.

Specifically, as shown in FIG. 6A, the wiring circuit 32 is pattern formed on one surface of the third resin base 31, and then, as shown in FIG. 6B, the adhesive layer 39 is formed on a surface on an opposite side to the wiring circuit 32. Note that if, for example, the third resin base 31 has a thickness of about 20 µm and the adhesive layer 39 has a thickness of about 25 µm, the third printed wiring board 30 may have a thickness of about 45 µm. The other printed wiring boards 10, 20, 40, and 50 may be formed to have similar thicknesses.

Figure 6C:
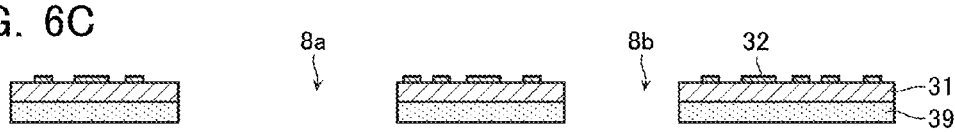
FIG. 6C is a cross-sectional view showing the electronic component built-in multi-layer wiring board due to same method of manufacturing, on a manufacturing process basis.
Figure 6D:
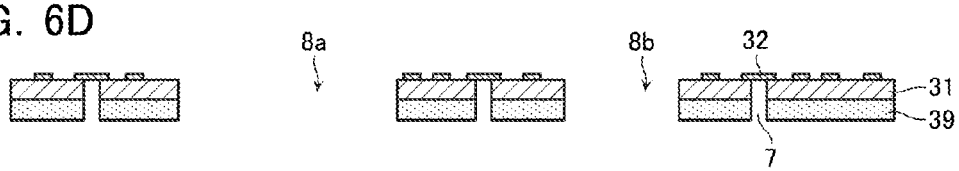
FIG. 6D is a cross-sectional view showing the electronic component built-in multi-layer wiring board due to same method of manufacturing, on a manufacturing process basis.
Figure 6E:
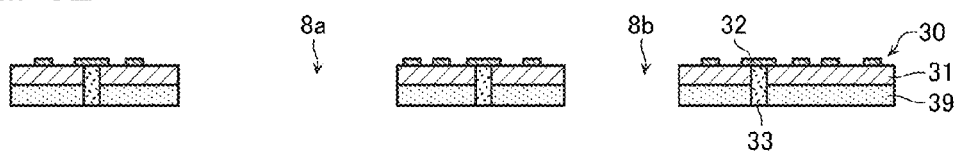
FIG. 6E is a cross-sectional view showing the electronic component built-in multi-layer wiring board due to same method of manufacturing, on a manufacturing process basis.

Next, as shown in FIG. 6C, openings 8a and 8b are formed by the above UV-YAG laser or the like, at the certain locations where the electronic component package 100 and the second electronic component 200 are to be housed. As shown in FIG. 6D, through-holes 7 are formed from the adhesive layer 39 to the wiring circuit 32, and conductive paste is filled into the through-holes 7 to form the vias 33. The third printed wiring board 30 is thus formed as shown in FIG. 6E.

Figure 6F:
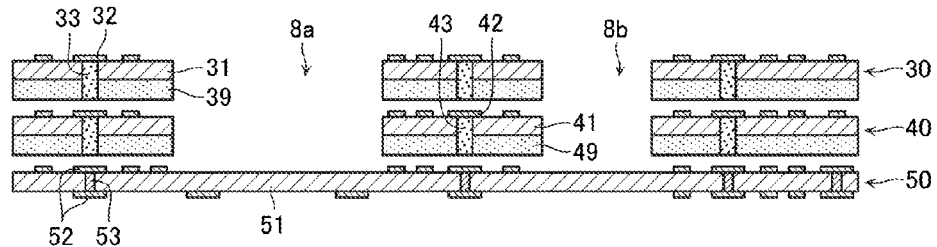
FIG. 6F is a cross-sectional view showing the electronic component built-in multi-layer wiring board due to same method of manufacturing, on a manufacturing process basis.
Figure 6G:
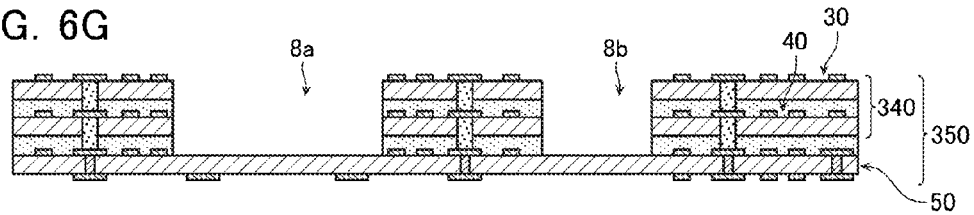
FIG. 6G is a cross-sectional view showing the electronic component built-in multi-layer wiring board due to same method of manufacturing, on a manufacturing process basis.

Likewise the fourth printed wiring board 40 is manufactured and the separately manufactured fifth printed wiring board 50 is provided. As shown in FIG. 6F, they are then aligned and stacked. As shown in FIG. 6G, they are temporarily compression-bonded by thermal compression bonding, thus forming the lamination 350 that includes the lamination 340 and has the openings 8a and 8b (step S104).

Figure 6H:
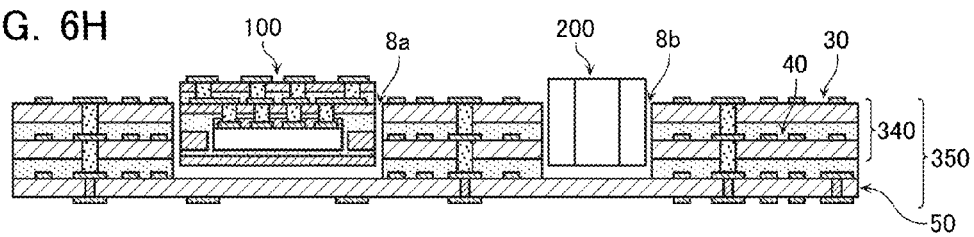
FIG. 6H is a cross-sectional view showing the electronic component built-in multi-layer wiring board due to same method of manufacturing, on a manufacturing process basis.

Then, as shown in FIG. 6H, the separately manufactured and prepared electronic component package 100 and second electronic component 200 are inserted into the openings 8a and 8b using the mounting mounter device or the like and mounted on the fifth printed wiring board 50 (step S106). Note that the electronic component package 100 is mounted such that, for example, the wiring circuits 142 in the outermost layer of the package are located opposite to the fifth printed wiring board 50.

Figure 6I:
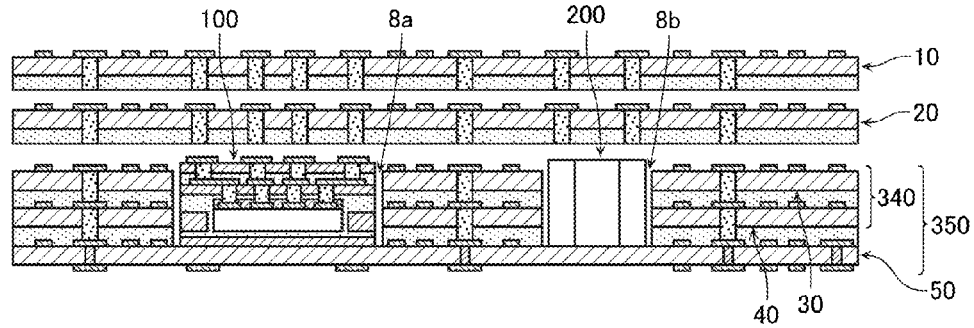
FIG. 6I is a cross-sectional view showing the electronic component built-in multi-layer wiring board due to same method of manufacturing, on a manufacturing process basis.

From the same point of view, the second electronic component 200 is mounted such that the electrodes (not shown) of the component are located in a location similar to the location of the wiring circuit 142 of the electronic component package 100. Finally, as shown in FIG. 6I, the first and second printed wiring boards 10 and 20 are aligned to be stacked on the third printed wiring board 30 of the lamination 350, and then the structure is subjected to thermal compression bonding, thus manufacturing the multi-layer wiring board 1 according to the present embodiment of the kind as shown in FIG. 1.

As described above, the electronic component built-in multi-layer wiring board and the method of manufacturing the same according to the present embodiment may improve the reliability of alignment and handling of the electronic component package 100 or the like, and may enlarge, in the electronic component package 100, the electrode pitch of the rewiring electrodes 61 of the built-in first electronic component 60 to a pitch equal to the wiring pitch of the wiring circuit 12 or the like of the electronic component built-in multi-layer wiring board 1, thus improving the reliability of the wiring line. Thus, the electronic component built-in multi-layer wiring board may be manufactured readily at a low cost that has built in the first electronic component 60 or the like and that may respond to the high densification.

Figure 7:
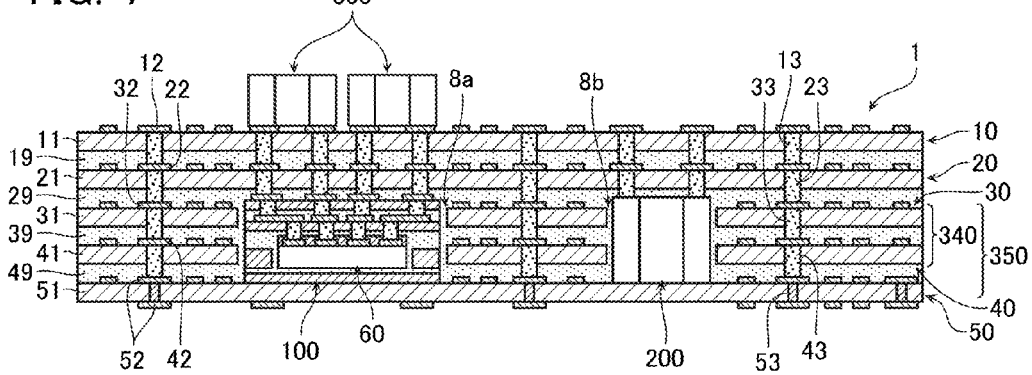
FIG. 7 is a cross-sectional view showing a structure of an electronic component built-in multi-layer wiring board according to another embodiment of the present invention; and The accompanying drawings, which are incorporated in and constitute a part of the specification, illustrate embodiments of the invention, and together with the general description given above and the detailed description of the embodiments given below, serve to explain the principles of the invention.

FIG. 7 is a cross-sectional view showing a structure of an electronic component built-in multi-layer wiring board according to another embodiment of the present invention. As shown in FIG. 7, a multi-layer wiring board 1 according to another embodiment is different from the multi-layer wiring board 1 according to the above embodiment in that it surface-mounts a third electronic component 300 immediately above the built-in location of the electronic component package 100 in the multi-layer wiring board 1, the third electronic component 300 being different from the first electronic component 60 built in to the electronic component package 100 and second electronic component 200.

The third electronic component 300 is surface mounted with the electrode pitch of the electrodes (not shown) of the component being formed equal to the wiring pitch of the wiring circuits 12 or the like of the multi-layer wiring board 1. Therefore, in the multi-layer wiring board 1 according to this embodiment, the electrodes of the third electronic component 300 are connected by the electrically shortest path to the rewiring electrodes 61 of the first electronic component 60 of the electronic component package 100 via the wiring circuits 12 and 22 and the vias 13 and 23 of the first and second printed wiring boards 10 and 20, respectively.

Thus, the electronic component may be surface mounted with easy impedance control by noise reduction. Note that the third electronic component 300 may actually be the same as the first or second electronic component 60 or 200 and, in some built-in aspects of the electronic component package 100 in the multi-layer wiring board 1, the third electronic component 300 may be surface mounted immediately below the built-in location, for example. In addition, although the electronic component package 100 is described as comprising the same material as the multi-layer wiring board 1, it may comprise a different material.

While certain embodiments have been described, these embodiments have been presented by way of example only, and are not intended to limit the scope of the inventions. Indeed, the novel methods and device described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic component built-in multi-layer wiring board that comprises collectively stacked therein a plurality of first printed wiring boards by thermal compression bonding, and that comprises an electronic component package built in thereto, wherein
the electronic component package comprises a first electronic component built in thereto and a plurality of second printed wiring boards stacked to have first electrodes on an outermost surface of the package, the first electronic component including second electrodes, wherein a pitch of adjacent electrodes of the first electrodes is wider than a pitch of adjacent electrodes of the second electrodes of the first electronic component and the pitch of the adjacent electrodes of the first electrodes is matched to a wiring pitch of the first printed wiring boards, the first electrodes being connected to the second electrodes in one-to-one correspondence, the electronic component built-in multi-layer wiring board includes a second electronic component having a thickness which is greater than that of the first electronic component, and further comprising a third electronic component different from the first and second electronic components, the third electronic component being surface-mounted immediately above or below the built-in location of the electronic component package with electrodes of the third electronic component formed at a pitch matched to the wiring pitch of the first printed wiring board being connected to the electrodes of the electronic component package by an electrically shortest path.

2. The electronic component built-in multi-layer wiring board according to claim 1, wherein the electronic component package comprises, in the second printed wiring boards:

a first-layer wiring board disposed on a rear surface side which is an opposite side to the electrode formation surface side of the first electronic component;

a second-layer wiring board having formed therein an opening where the first electronic component is built;

a third-layer wiring board comprising conductive paste vias formed therein at a pitch matched to the electrode pitch of the first electronic component, and electrodes formed on one surface thereof, the electrodes enlarging the pitch from the electrode pitch of the first electronic component to the wiring pitch of the first printed wiring board; and a fourth-layer wiring board comprising electrodes formed on one surface thereof at a pitch matched to the wiring pitch of the first printed wiring board and conductive paste vias formed therein, the first-layer to forth-layer wiring boards are collectively stacked with the first electronic component built in to the opening of the second-layer wiring board with the conductive paste vias in the third-layer wiring board being opposed to the electrodes of the first electronic component, and with the conductive paste vias in the fourth-layer wiring board being disposed opposed to the electrodes of the third-layer wiring board.

3. The electronic component built-in multi-layer wiring board according to claim 1, wherein the second printed wiring board is formed by an identical material to that of the first printed wiring board.

4. The electronic component built-in multi-layer wiring board according to claim 1, wherein a certain first printed wiring board of a plurality of first printed wiring boards disposed in an interlayer of the electronic component built-in multi-layer wiring board has formed therein openings capable of mounting the second electronic component and the electronic component package, respectively, and with the second electronic component and the electronic component package being mounted in the respective openings, the first printed wiring boards are collectively stacked.

5. A method of manufacturing an electronic component built-in multi-layer wiring board, the electronic component built-in multi-layer wiring board comprising collectively stacked therein a plurality of first printed wiring boards by thermal compression bonding, and the electronic component built-in multi-layer wiring board comprising an electronic component package built in thereto, the method comprising the steps of:

forming the electronic component package by providing a first electronic component to be built in the package and by stacking a plurality of second printed wiring boards to have first electrodes on an outermost surface of the package, the first electronic component including second electrodes, wherein a pitch of adjacent electrodes of the first electrodes is wider than a pitch of adjacent electrodes of the second electrodes of the first electronic component and the pitch of the adjacent electrodes of the first electrodes is matched to a wiring pitch of the first printed wiring boards, the first electrodes being connected to the second electrodes in one-to-one correspondence, forming in a certain first printed wiring board of the plurality of first printed wiring boards openings capable of mounting a second electronic component having a thickness which is greater than that of the first electronic component and the electronic component package, respectively, and stacking, with the second electronic component and the electronic component package being mounted in the respective openings, the first printed wiring boards to close the openings, and providing a third electronic component different from the first and second electronic components, the third electronic component being surface-mounted immediately above or below the built-in location of the electronic component package with electrodes of the third electronic component formed at a pitch matched to the wiring pitch of the first printed wiring board being connected to the electrodes of the electronic component package by an electrically shortest path.

6. A method of manufacturing an electronic component built-in multi-layer wiring board according to claim 5, wherein the step of forming the electronic component package comprising collectively stacking, in the second printed wiring boards, a first-layer wiring board disposed on a rear surface side which is an opposite side to the electrode formation surface side of the first electronic component;

a second-layer wiring board having formed therein an opening where the first electronic component is built;

a third-layer wiring board comprising conductive paste vias formed therein at a pitch matched to the electrode pitch of the first electronic component, and electrodes formed on one surface thereof, the electrodes enlarging the pitch from the electrode pitch of the first electronic component to the wiring pitch of the first printed wiring board; and a fourth-layer wiring board comprising electrodes formed on one surface thereof at a pitch matched to the wiring pitch of the first printed wiring board and conductive paste vias formed therein, the collectively stacking being carried out with the first electronic component being built in to the opening of the second-layer wiring board with the conductive paste vias in the third-layer wiring board being opposed to the electrodes of the first electronic component, and with the conductive paste vias in the fourth-layer wiring board being disposed opposed to the electrodes of the third-layer wiring board.

* * * * *